(12) United States Patent
Thiel

(10) Patent No.: US 8,500,965 B2
(45) Date of Patent: Aug. 6, 2013

(54) MSVD COATING PROCESS

(75) Inventor: James P. Thiel, Pittsburgh, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 2899 days.

(21) Appl. No.: 10/841,986

(22) Filed: May 6, 2004

(65) Prior Publication Data

US 2005/0247555 A1    Nov. 10, 2005

(51) Int. Cl.
*C23C 14/00* (2006.01)
*C23C 14/32* (2006.01)

(52) U.S. Cl.
USPC ............ 204/192.16; 204/192.15; 204/192.12; 204/192.26

(58) Field of Classification Search
USPC ............ 204/192.26, 192.12, 298.03, 192.13, 204/192.15, 192.16; 427/488; 228/155; 428/655, 626; 438/669; 8/685
See application file for complete search history.

(56) References Cited

U.S. PATENT DOCUMENTS

| | | | |
|---|---|---|---|
| 3,083,551 A | 4/1963 | Pilkington | 65/32 |
| 3,220,816 A | 11/1965 | Pilkington | 65/99 |
| 3,843,346 A | 10/1974 | Edge et al. | 65/65 A |
| 4,379,040 A | 4/1983 | Gillery | 204/192 P |
| 4,444,618 A * | 4/1984 | Saia et al. | 438/669 |
| 4,462,883 A * | 7/1984 | Hart | 204/192.26 |
| 4,746,347 A | 5/1988 | Sensi | 65/94 |
| 4,792,536 A | 12/1988 | Pecoraro et al. | 501/70 |
| 4,861,669 A | 8/1989 | Gillery | 428/434 |
| 4,900,633 A | 2/1990 | Gillery | 428/432 |
| 5,080,774 A * | 1/1992 | Heitzer | 204/298.11 |
| 5,085,926 A * | 2/1992 | Iida et al. | 428/216 |
| 5,240,886 A | 8/1993 | Gulotta et al. | 501/70 |
| 5,298,048 A | 3/1994 | Lingle et al. | 64/60.2 |
| 5,338,422 A * | 8/1994 | Belkind et al. | 204/192.12 |
| 5,385,872 A | 1/1995 | Gulotta et al. | 501/71 |
| 5,393,593 A | 2/1995 | Gulotta et al. | 428/220 |
| 5,423,970 A * | 6/1995 | Kugler | 204/298.03 |
| 5,425,861 A | 6/1995 | Hartig et al. | 204/192.26 |
| 5,441,615 A * | 8/1995 | Mukai et al. | 204/192.12 |
| 5,589,280 A * | 12/1996 | Gibbons et al. | 428/626 |
| 6,168,698 B1 * | 1/2001 | Szczyrbowski et al. | 204/298.25 |
| 6,283,357 B1 * | 9/2001 | Kulkarni et al. | 228/155 |
| 6,309,427 B1 * | 10/2001 | Korte | 8/685 |
| 6,336,999 B1 * | 1/2002 | Lemmer et al. | 204/192.13 |
| 6,495,251 B1 * | 12/2002 | Arbab et al. | 428/336 |
| 6,613,393 B1 * | 9/2003 | Rauschnabel et al. | 427/488 |
| 6,797,128 B1 * | 9/2004 | Szyszka et al. | 204/192.13 |
| 6,921,579 B2 * | 7/2005 | O'Shaughnessy et al. | 428/432 |
| 2004/0241490 A1 * | 12/2004 | Finley | 428/655 |
| 2005/0205413 A1 * | 9/2005 | Ikari et al. | 204/192.13 |

FOREIGN PATENT DOCUMENTS

| | | |
|---|---|---|
| WO | WO 97/00335 | 1/1997 |
| WO | WO 0222516 A1 * | 3/2002 |

OTHER PUBLICATIONS

Bay definition. Merriam-Webster Online Dictionary. [http://www.merriam-webster.com/dictionary/bay?show=2&t=1297973556] [Accessed on Feb. 14, 2011].*

* cited by examiner

*Primary Examiner* — Jonathan Johnson
*Assistant Examiner* — Michael Band
(74) *Attorney, Agent, or Firm* — Andrew C. Siminerio

(57) ABSTRACT

The present invention is a method of coating a substrate in a single zone of a MSVD coater wherein the zone includes at least two bays, comprising running a first bay of a zone including a first target in metal mode and running the second bay including a second target in transition or oxide mode, wherein the ΔG of formation of the target oxide being run in transition mode or oxide mode is equal to or less than −160 kcal/mole $O_2$ or the difference in ΔG between the target being run in transition mode or oxide mode and the target being run in metal mode is at least 60 kcal/mole $O_2$.

13 Claims, No Drawings

MSVD COATING PROCESS

FIELD OF INVENTION

The present invention relates to methods for coating substrates; especially magnetron vacuum sputtering deposition methods.

BACKGROUND

Glass substrates are used in a variety of applications including architectural applications, automotive applications, consumer appliances, etc. Oftentimes, the glass is coated with a functional coating(s) to provide the required properties. Examples of functional coatings include solar control coatings, conductive coatings, photocatalytic coatings, low emissivity coatings, etc.

Today, scientists and engineers are devising increasingly complex functional coatings. More specifically, functional coatings are being designed with more discrete coating layers. Generally, the more discrete layers of coating in a multi-layer coating stack, the easier it is to control properties of the coated substrate such as color and solar properties, e.g., emissivity.

Several techniques, such as chemical vapor deposition ("CVD"), spray pyrolysis, and magnetron sputtered vacuum deposition ("MSVD") are known in the art for applying functional coatings on a substrate. MSVD processes are best suited for complex coatings containing one or more coating layers because they allow for a wider selection of coating materials to be deposited at thinner thicknesses on a broader variety of substrates.

MSVD processes are performed in coaters having one or more coating zones. A typical MSVD coater has between four and twenty zones. Each zone includes one or more targets, usually three, for depositing a specific type of material on a substrate. Each target is placed in a bay which has its own gas feeds by which gas comes into the zone. Although gas comes into a zone in different places, all of the gas that comes into the zone leaves at a certain place in the zone.

Each zone in a coater is run, i.e. operated to deposit a coating layer, in one of three modes—metal mode, transition mode, or oxide mode. Generally speaking, the amount of reactive gas, e.g. a gas like hydrogen or nitrogen that is capable of reacting with a target in the zone, determines the mode. In metal mode, the gaseous atmosphere in the zone consists of only non-reactive gas, e.g. argon, and the zone is run to deposit a layer of metal on a substrate. Of the three modes, metal mode generally has the fastest deposition rate, with the exception of a few target materials such as tungsten. In transition mode, the gaseous atmosphere in the zone consists of both non-reactive gas and a reactive gas, and the zone is run to deposit a layer of oxide on the substrate. The concentration of the reactive gas is constantly monitored and adjusted to ensure the oxide layer is being deposited at the maximum rate. The deposition rate in transition mode is slower than the deposition rate of metal mode but faster than the deposition rate of oxide mode. In oxide mode, the gaseous atmosphere in the zone consists of both non-reactive gas and reactive gas, and the zone is run to deposit a layer of oxide on the substrate. Of the three modes, oxide mode has the slowest deposition rate. The deposition rate in metal mode can be up to ten times faster than the deposition rate in oxide mode.

Conventionally, each bay in a single zone in an MSVD coater is run in the same mode; either metal mode, transition mode, or oxide mode. If different bays in a zone were run in different modes, oxide mode and metal mode, for example, reactive gas entering the bay being run in oxide mode could leak over (also referred to as "bleed through") into the bay being run in metal mode and negatively impact the deposition process. The desired metal layer would not be deposited and/or the speed of the deposition would be reduced.

Because a single zone is always run in one mode, the types of coating compositions that can be deposited and the efficiency at which they can be deposited (the faster the rate of deposition, the faster the rate of production) are limited by the total number of zones in the coater. For example, a coating that has three silver layers sandwiched by four zinc oxide layers cannot be deposited via a continuous process in a coater having less than seven zones. Four zones are required to run in either oxide mode or transition mode to deposit the layers of zinc oxide and three zones are required to run in metal mode to deposit the silver layers. Although it may be possible to produce the described coating in a coater have less than seven zones by running the substrate through the coater more than once, such is undesirable for several reasons, chief among them, efficiency.

Coaters can be expanded to include more coating zones. Some multi-zone coaters are designed to accommodate an expansion to include more zones, but others are not. Regardless, it is expensive to add more zones to an existing coater. Typically, it will cost between $1 and $5 million to add one zone to an existing coater, depending on whether the coater was designed for expansion or not.

It would be extremely beneficial to have a method for coating substrates in a MSVD multi-zone coater that reduces the total number of zones required to deposit a coating. The present invention provides a method for coating a substrate that includes running a single zone of a MSVD multi-zone coater in at least two different modes, thereby reducing the total number of zones required to apply a given coating.

SUMMARY OF THE INVENTION

In a non-limiting embodiment, the present invention is a method of coating a substrate in a single zone of a MSVD coater wherein the zone includes at least two bays, comprising running a first bay of a zone including a first target in metal mode and running a second bay of a zone including a second target in transition or oxide mode, wherein the $\Delta G$ of formation of the target being run in transition mode or oxide mode is equal to or less than $-160$ kcal/mole $O_2$ or the difference in $\Delta G$ between the target being run in transition mode or oxide mode and the target being run in metal mode is at least 60 kcal/mole $O_2$.

In another non-limiting embodiment, the present invention is a method of coating a substrate in a single zone of a MSVD coater wherein the zone includes at least two bays, comprising running a first bay of a zone including a target comprising silver in metal mode and running a second bay of a zone including a target comprising a mixture of aluminum and silicon in oxide mode.

In yet another non-limiting embodiment, the present invention is a method of coating a substrate in a single zone of a MSVD coater wherein the zone includes at least two bays, comprising running a first bay of a zone including a target comprising titanium in transition mode and running a second bay of a zone including a target comprising a mixture of aluminum and silicon in oxide mode.

DESCRIPTION OF THE INVENTION

As used herein, spatial or directional terms, such as "left", "right", "inner", "outer", "above", "below", "top", "bottom", and the like, relate to the invention as it is shown in the drawing figures. However, it is to be understood that the invention may assume various alternative orientations and, accordingly, such terms are not to be considered as limiting.

Further, as used herein, all numbers expressing dimensions, physical characteristics, processing parameters, quantities of ingredients, reaction conditions, and the like, used in the specification and claims are to be understood as being modified in all instances by the term "about". Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to encompass the beginning and ending range values and any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1.0 to 3.8, 6.6 to 9.7 and 5.5 to 10.

As used herein, the terms "applied on/over", "formed on/over", "deposited on/over", or "provided on/over" mean formed, deposited, overlay or provided on but not necessarily in contact with the surface. For example, a coating layer "formed over" a substrate does not preclude the presence of one or more other coating layers or films of the same or different composition located between the formed coating layer and the substrate. For instance, the substrate can include a conventional coating such as those known in the art for coating substrates, such as glass or ceramic.

As used herein, the term "running a coater" refers to the operation of a coater in a manner that results in a coating layer(s) being deposited on a substrate.

The method of the present invention comprises running a single zone of an MSVD coater in at least two different modes to deposit a layer(s) of coating on a substrate. For example, the present invention encompasses the following non-limiting embodiments: running one bay in a zone in metal mode and running another bay in the zone in transition mode; running one bay in a zone in metal mode and running another bay in the zone in oxide mode; and running one bay in a zone in transition mode and running another bay in the zone in oxide mode.

According to the present invention, conventional MSVD processes and equipment are utilized as is well known in the art. Suitable MSVD processes are described in the following references, which are hereby incorporated by reference: U.S. Pat. Nos. 4,379,040; 4,861,669; and 4,900,633.

Typically, the zone is a vacuum chamber equipped with various pumps to evacuate the chamber and to introduce one or more gases into the chamber as is well known in the art. The zone is isolated from other zones in the MSVD coater by narrow tunnels and/or pumps. The zone contains at least two targets, generally three. Each target is housed in a bay which has its own gas feed. Although the targets have separate gas feeds, all of the gas fed into the zone is pumped out from one location.

The targets utilized in the present invention are typical targets as are well known in the art for an MSVD process. A non-limiting example of a suitable target is a rotary target commercially available from AIRCO Coating Technology under the trademark "C-MAG". Non-limiting examples of suitable targets include those made of gold, copper, silver, zirconium, hafnium, aluminum, and yttrium as well as combinations of the aforementioned metals and alloys thereof. The previously mentioned targets are generally used to sputter deposit as a metal layer; hence, they are generally sputtered in metal mode. Other non-limiting examples of suitable targets include those made of titanium, silicon, tin, zinc, aluminum, combinations thereof, etc. The previously mentioned targets are generally used to sputter deposit as an oxide layer; hence, they are generally sputtered in either transition mode or oxide mode.

In a non-limiting embodiment of the invention, a target can comprise from 5 weight percent to 95 weight percent aluminum and 5 weight percent to 95 weight percent silicon, for example, 10 weight percent to 90 weight percent aluminum and 90 weight percent to 10 weight percent silicon, or 15 weight percent to 90 weight percent aluminum and 85 weight percent to 10 weight percent silicon, or 50 weight percent to 75 weight percent aluminum and 50 weight percent to 25 weight percent silicon. Specifically, the target can comprise 60 weight percent silicon and 40 weight percent aluminum; or 25 weight percent silicon and 75 weight percent aluminum; or 90 weight percent silicon and 10 weight percent aluminum.

The targets in the zone need to be chosen effectively to carry out the present invention. More particularly, the targets that can be placed in a single zone to carry out the present invention depend on the coating to be deposited, the Gibbs Free Energy of formation ($\Delta G$) of the target oxides in the zone, and the deposition rates of the respective targets. $\Delta G$ is energy which is, or which can be, available to do useful work.

$\Delta G$ can be defined in the following manner. $\Delta G=\Delta H-T\Delta S$ where H is the enthalpy, S is the entropy, and T is the absolute temperature. As used herein, the terms enthalpy, entropy, and absolute temperature are defined as is well known the art.

In a non-limiting embodiment of the invention, the $\Delta G$ of the target(s) oxides being run in transition mode or oxide mode is equal to or less than $-160$ kcal/mole $O_2$, for example $-165$ kcal/mole $O_2$. When $\Delta G$ is equal to or less than $-160$ kcal/mole $O_2$, the target absorbs all of the reactive gas and there is none left to bleed through to other targets in the zone. Numerical values for the $\Delta G$ for many oxides can be found in *Free Energy of Formation of Binary Compound,* by Thomas Reed, MIT Press, ISBN 0 262 18051 0.

In a non-limiting embodiment of the invention where the target(s) being run in transition mode or oxide mode is not equal to or less than $-160$ kcal/mole $O_2$, the difference in $\Delta G$ between the target(s) being run in transition mode or oxide mode and the target(s) being run in metal mode should be at least 60 kcal/mole $O_2$, for example, at least 75 kcal/mole $O_2$, or at least 100 kcal/mole $O_2$. The bigger difference in $\Delta G$ between the target(s) being run in transition mode or oxide mode and the target(s) being run in metal mode, the better the invention will operate because the chances of any bleed through is minimized. Also, the closer the $\Delta G$ of the target(s) being run in transition mode or oxide mode is to zero, the more bleed through is likely to occur because the target's affinity to react with reactive gas in its bay is not as high.

In some cases, the amount of bleed through (and hence the difference in $\Delta G$ between the target(s) being run in transition mode or oxide mode and the target(s) being run in metal mode) is not as important as it is in others. The required difference in $\Delta G$ between the target(s) being run in transition mode or oxide mode and the target(s) being run in metal mode depends on the coating layers that are being deposited. For example, if a bay including a titanium target is being sputtered in metal mode to deposit a layer of titanium, but the layer of titanium is being deposited to eventually convert to titania, the bleed through from a bay being run in oxide mode or metal mode is less critical to the formed coating configuration. The titanium is being deposited so that it may be oxidized during subsequent processing.

In another non-limiting embodiment of the present invention where a bay(s) is being run in metal mode to deposit a metal layer and the metal layer is desired in the final coating, only a minimal amount of bleed through from a bay(s) in the zone being run in transition mode or oxide mode can be tolerated. Otherwise, a compound like an oxide layer rather than a metal layer will be deposited. Table 1 below contains ΔG values for some common target materials.

TABLE 1

ΔG Values

| Material | ΔG [kcal/mole $O_2$] |
|---|---|
| $Cu_2O$ | −70 |
| Pt | −32 |
| $SnO_2$ | −130 |
| TiO | −242 |
| $TiO_2$ | −216 |
| ZnO | −160 |
| $Ag_2O$ | −12 |
| $Al_2O_3$ | −258 |
| $SiO_2$ | −216 |
| $ZrO_2$ | −258 |

As is well known in the art, the deposition rate of a particular target can be adjusted to account for a given amount of bleed through. For example, if a bay being run in transition mode or oxide mode is bleeding through oxygen, the deposition rate of the target can be slowed by reducing the power to the target. By reducing the deposition rate of the target, the reactions between the target and the reactive gas can be increased. The more reactions occurring between the reactive gas and the target, the less bleed through from the bay.

The method of the present invention can be used on various substrates. Examples of suitable substrates include, but are not limited to, metal substrates, such as but not limited to steel, galvanized steel, stainless steel, and aluminum; ceramic substrates; tile substrates; glass substrates; or mixtures or combinations of any of the above. For example, the substrate can be conventional untinted soda-lime-silica-glass, i.e., "clear glass", or can be tinted or otherwise colored glass, borosilicate glass, leaded glass, tempered, untempered, annealed, or heat-strengthened glass. The glass can be of any type, such as conventional float glass or flat glass, and can be of any composition having any optical properties, e.g., any value of visible radiation transmission, ultraviolet radiation transmission, infrared radiation transmission, and/or total solar energy transmission. Types of glass suitable for the practice of the invention are described, for example but not to be considered as limiting, in U.S. Pat. Nos. 4,746,347; 4,792,536; 5,240,886; 5,385,872; and 5,393,593.

In non-limiting embodiments where glass is the substrate, the substrate can be any thickness. Generally, the substrate is thicker for architectural applications than for automotive applications. In a non-limiting embodiment for an architectural application, the substrate can be glass having a thickness ranging from 1 mm to 20 mm, for example, 1 mm to 10 mm, or 2 mm to 6 mm. In a non-limiting embodiment for an automotive application, the substrate can be at least one glass ply in a laminated automotive windshield or sidelight. In automotive applications, the glass typically is up to 5.0 mm thick, for example, up to 3.0 mm thick, or up to 2.5 mm thick, or up to 2.1 mm thick.

The glass substrate can be manufactured using conventional float processes, e.g., as described in U.S. Pat. Nos. 3,083,551; 3,220,816; and 3,843,346 which are hereby incorporated by reference.

According to the present invention, the following steps are undertaken to accomplish the method of the present invention. First, the proper gaseous atmosphere is created in each zone by continuously pumping one or more inert gases and/or one or more reactive gases into the bays in the zone and pumping the gas out at one location in the zone. As is well known in the art, the proper gaseous atmosphere depends on the composition of the coating layer(s) that is being deposited.

Second, after the proper gaseous atmosphere is established, movement of the substrate through the zone is initiated and the magnetrons are energized. Molecules of the inert gas begin a cascade ionization process and form a plasma cloud of ions and electrons between the target and the substrate. The core of the plasma cloud has equal amounts of positive and negative charges. The positively charged ions at the plasma cloud edge, driven by an electric field, leave the plasma cloud and move toward the target surface and bombard the target material. The bombardment causes the target to disintegrate atom-by-atom in the direction of the substrate and ultimately deposit on the substrate.

When the target is being sputtered in transition mode or oxide mode, the molecules of the reactive gas in the bay react with the sputtered atoms of the target material as they travel through the plasma cloud and impinge on the substrate. The end result is a deposited layer comprising a reacted compound, e.g., an oxide or a nitride of a metal, on the substrate. When the target is being sputtered in metal mode, the plasma cloud impinges on the target material to cause a metal layer to be deposited on the substrate.

As the substrate passes through different zones in the multi-zone coater, various coating layers are sequentially deposited on the substrate. The coating compositions produced via MSVD processes are uniform, very adherent and resistant to abrasion, peeling and cracking.

In a non-limiting embodiment of the invention, during the sputtering process, a portion of the substrate is only exposed to one target at a time. This embodiment allows discreet layers of coating to be deposited from a single target.

In another non-limiting embodiment of the invention, during the sputtering process, a portion of the substrate is exposed to more than one target of different materials at a given time. This embodiment enables a layer of coating to be deposited that is a mixture of materials from more than one target (e.g., a gradient coating layer).

For example, a gradient layer comprised of two materials, a first material and a second material, as described below can be formed. The gradient layer can be deposited in such a manner that the concentration of the first material is greatest near the bottom of the coating layer and the concentration of the second material changes, e.g., gradually increases, as the distance from the bottom of the coating layer increases. The region of coating furthest from the bottom of the coating layer has the greatest concentration of the second material.

A substrate coated according to the present invention can receive additional layer of coating and can be heated. In a non-limiting embodiment of the invention, the coated substrate is heated, for example, to oxidize or further oxidize a metal within the coating stack.

Additional layers such as a heat absorbing material like carbon can be applied on the coated substrate. Such a coating layer is beneficial if the coated substrate will need to be heated rapidly. Because all of the carbon can be consumed during the heating process, a final coated substrate can be made that does not include the carbon layer.

In a non-limiting embodiment of the present invention, a zone in a MSVD multi-zone coater has at least one bay run in metal mode and at least one bay run in either transition mode or oxide mode. The bay that will be run in metal mode comprises a target comprising silver as is well known in the art. A gaseous stream comprised of an inert gas, like argon, is fed into the bay containing the silver target. The silver target is sputtered to deposit a layer of silver on the substrate. The sputtering is carried out using conventional power levels and under standard conditions as is well known in the art.

The bay that will be run in either transition mode or oxide mode comprises a target comprising a mixture of aluminum and silicon as is well known in the art. Two gaseous streams are fed into the bay containing the aluminum/silicon target. One stream comprises an inert gas, like argon, and the other stream comprises a reactive gas, like oxygen. The aluminum/silicon target is sputtered to deposit a layer of a mixture of alumina and silica on the silver layer. The amount of reactive gas in the bay being run in transition mode or oxide mode is established such that the reactive gas does not bleed through to the bay being run in metal mode.

If the bay is being run in transition mode, the gaseous environment in the bay is maintained to have very low levels of oxygen to keep the deposition rate of the target as high as possible. The minimum amount of oxygen necessary to deposit the target of aluminum and silicon as an oxide is fed into the bay. The amount of oxygen in the bay is adjusted every few milliseconds by means of a feedback system like a plasma emission monitoring (PEM) which is well known in the art. The amount of reactive gas in the bay is very important for several reasons. If too much reactive gas is present in a bay, reactions occur on the target surface (referred to as "target poisoning" in the art) and not in the sputtered plasma, causing the deposition rate to decrease from a transition mode rate to an oxide mode rate. If too little reactive gas is present in the bay, a sub-stoichiometric compound, such as a sub-oxide, and not the desired compound will be deposited on the substrate.

In the non-limiting embodiment discussed above, the thickness of the deposited silver layer can range from 50 Å to 300 Å, for example, from 60 Å to 200 Å, or from 70 Å to 150 Å. The thickness of the deposited alumina/silica layer can range from 40 Å to 400 Å, for example, 100 Å to 350 Å, or 150 Å to 250 Å.

Optionally, a bay containing a target comprising a second metal that is different from the other metal in the zone, i.e. silver in this embodiment, can be located in a third bay between the two bays discussed above. Suitable second metals for the target include gold, copper, silver, titanium, zirconium, hafnium, yttrium and mixtures and alloys thereof.

In a non-limiting embodiment of the invention, a target comprising titanium as is well known in the art is located in a bay between the silver target and the aluminum/silicon target in the non-limiting embodiment discussed above. The titanium target can be used to react with any reactive gas bleeding through from the bay being run in transition mode or oxide mode comprising aluminum and silicon so that no reactive gas reaches the bay housing the metal being run in metal mode.

In another non-limiting embodiment of the present invention, at least one bay in a zone is run in oxide mode and another bay in the zone is run in transition mode. The bay that will be run in oxide mode contains a target comprising a mixture of aluminum and silicon as is well known in the art. Two gaseous streams are fed into the bay. One stream comprises an inert gas, like argon, and the other stream comprises a reactive gas, like oxygen. The aluminum/silicon target is sputtered to deposit a layer of alumina/silica on the substrate. The sputtering is carried out using conventional power levels and under standard conditions as is well known in the art.

The bay that will be run in transition mode contains a target comprising titanium as is well known in the art. Two gaseous streams are fed into the bay containing the titanium target. One stream comprises an inert gas, like argon, and the other stream comprises a reactive gas like, oxygen. The titanium target is sputtered to deposit a titanium-containing layer on the layer of alumina/silica. The gaseous environment in the bay is maintained to have very low levels of oxygen to keep the deposition rate of the target as high as possible. The minimum amount of oxygen necessary to deposit the target as an oxide is fed into the bay. The amount of oxygen in the bay is adjusted every few milliseconds by means of a feedback system like a plasma emission monitoring (PEM) which is well known in the art.

The thickness of the deposited alumina/silica layer can range from 40 Å to 400 Å, for example, from 100 Å to 350 Å, or from 150 Å to 250 Å. The thickness of the deposited titanium-containing layer can range from 10 Å to 150 Å, for example, 20 Å to 110 Å, or 60 Å to 90 Å.

One of the unique aspects of the described embodiment is that it sputters a material that isn't an oxide at the time of deposition but can be converted to an oxide by heating or other means. Specifically, the deposited titanium can be converted to titania by heating.

It will be readily appreciated by those skilled in the art that modifications may be made to the invention without departing from the concepts disclosed in the foregoing description. Such modifications are to be considered as included within the scope of the invention. Accordingly, the particular embodiments described in detail hereinabove are illustrative only and are not limiting as to the scope of the invention, which is to be given the full breadth of the appended claims and any and all equivalents thereof.

What is claimed:

1. A method of coating a substrate with a metal layer and a metal oxide layer in a single zone of a MSVD coater, comprising:
    providing a first bay of a zone including a first target comprising a first metal to deposit a metal coating layer;
    providing a second bay of the zone including a second target comprising one or more metals to provide a metal oxide coating layer; and
    pumping a reactive gas selected from oxygen or nitrogen into the zone;
    wherein the second target has a $\Delta G$ of equal to or less than $-160$ kcal/mole $O_2$ or the difference in $\Delta G$ between the first target and the second target is at least 60 kcal/mole $O_2$.

2. The method according to claim 1 wherein the first target is selected from gold, copper, silver, titanium, zirconium, hafnium, yttrium and mixtures and alloys thereof.

3. The method according to claim 2 wherein the first target comprises silver.

4. The method according to claim 1 wherein the second target selected from titanium, silicon, tin, zinc, aluminum and combinations thereof in transition or oxide mode.

5. The method according to claim 4 wherein the second target comprises a mixture of aluminum and silicon.

6. The method according to claim 5 wherein the second target comprises 60 weight percent silicon and 40 weight percent aluminum.

7. The method according to claim 5 wherein the second target comprises 25 weight percent silicon and 75 weight percent aluminum.

8. The method according to claim 5 wherein the second target comprises 90 weight percent silicon and 10 weight percent aluminum.

9. The method according to claim 1 further comprising providing a third target comprising a second metal that is different from the first metal, the third target being located in a third bay between the first bay and the second bay.

10. The method according to claim 9 wherein the second metal is selected from gold, copper, silver, titanium, zirconium, hafnium, yttrium and mixtures and alloys thereof.

11. The method according to claim 10 wherein the second metal is titanium.

12. The method according to claim 1 wherein the coated substrate is glass.

13. A method of coating a glass substrate with both a metal layer and a metal oxide layer in a single zone of a MSVD coater, comprising:
   providing a silver target in a coating zone;
   providing a titanium target in the coating zone downstream of the silver target;
   providing a target comprising aluminum and silicon downstream of the titanium target;
   providing a reactive gas selected from oxygen and nitrogen into the coating zone; and
   passing a glass substrate through the coating zone to form a silver layer, a titanium layer on the silver layer, and an oxide layer comprising silica and alumina on the titanium layer,
   wherein the target comprising aluminum and silicon.

* * * * *